US006564355B1

(12) United States Patent
Smith et al.

(10) Patent No.: US 6,564,355 B1
(45) Date of Patent: May 13, 2003

(54) SYSTEM AND METHOD FOR ANALYZING SIMULTANEOUS SWITCHING NOISE

(75) Inventors: Larry D. Smith, San Jose, CA (US); Raymond E. Anderson, Santa Cruz, CA (US); Tanmoy Roy, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 86 days.

(21) Appl. No.: 09/651,678

(22) Filed: Aug. 30, 2000

Related U.S. Application Data
(60) Provisional application No. 60/151,535, filed on Aug. 31, 1999.

(51) Int. Cl.[7] .............................................. G06F 17/50
(52) U.S. Cl. ................................. 716/4; 716/5; 716/6
(58) Field of Search .............................. 716/4; 703/14, 703/18, 19

(56) References Cited

U.S. PATENT DOCUMENTS

| 5,477,460 A | | 12/1995 | Vakirtzis et al. | |
|---|---|---|---|---|
| 5,703,798 A | * | 12/1997 | Dhar | 703/14 |
| 6,066,177 A | * | 5/2000 | Hatsuda | 703/19 |

OTHER PUBLICATIONS

Pannala et al., "Contribution of Resonance to Ground Bounce in Lossy Thin Film Planes," © 1998 IEEE, pp. 185–188.
Libous, "Characterizaton of Flip–Chip CMOS ASIC Simultaneous Switching Noise on Multilayer Organic and Ceramic BGA/CGA Packages," © 1998 IEEE, pp. 191–194.
Chen et al., "Norton Equivalent Modeling of Microprocessor Core Noise from Measurements," © 1998 IEEE, pp. 195–198.
Kim et al., "Rejection of SSN Coupling in Multilayer PCB using a Conductive Layer," © 1998 IEEE, pp. 199–202.
Becker et al., "Modeling, Simulation, and Measurement of Mid–Frequency Simultaneous Switching Noise in Computer Systems," IEEE Transactions on Components, Packaging, and Manufacturing Technology—Part B., vol. 21, No. 2, May 1998, pp. 157–163.

(List continued on next page.)

*Primary Examiner*—Vuthe Siek
*Assistant Examiner*—Naum Levin
(74) *Attorney, Agent, or Firm*—Meyertons, Hood, Kivlin, Kowert & Goetzel, P.C.; B. Noël Kivlin

(57) ABSTRACT

A system and method for analyzing simultaneous switching noise. In one embodiment, a model may be provided for the electronic circuit to be analyzed. The electronic circuit may be an integrated circuit, a multi-chip module, a printed circuit assembly, or other type, and may in some embodiments include combinations of these types. The electronic circuit may include a plurality of drivers, each of which may be coupled to a power plane, a ground plane, and a transmission line. The connection of the driver may be accurately modeled in this manner. Each driver may be configured to switch between a logic high voltage and a logic low voltage. The modeled electronic circuit may also include a voltage source coupled to the power plane and the ground plane, a voltage regulator module, and a plurality of decoupling capacitors. The simultaneous switching of a plurality of drivers, from a logic high to a logic low, or vice versa, may be simulated. The system and method may then allow for the calculation of solutions for the transmission line and the power planes (as will be detailed below). The transmission line solution and power plane solution may be superimposed on each other, which may allow for an analysis of plane bounce, which may include one or more fluctuations in the voltage between the power plane and the ground planes.

55 Claims, 9 Drawing Sheets

OTHER PUBLICATIONS

Huber et al., "Time–Domain Investigation of Decoupling Capacitors on MCM," May 1999, 2 pgs.

Madou et al., "Electrical Characterisation of Capacitors Integrated in Multi–layer Printed Circuit Boards," May 1999, 2 pgs.

Pham et al., "Decoupling Capacitors Techniques for High Frequency Board Designs," Feb. 1999, pp. 127–135.

Fisher et al., "The Role of Capacitors in High–Speed Systems Design," Feb. 1999, pp. 137–155.

Lipa et al., "Flip–Chip Power Distribution," © 1998 IEEE, pp. 39–41.

Wu et al., "Accurate Power Supply and Ground Plane Pair Models," © 1998 IEEE, pp. 163–166.

Moll et al., "Extraction of Equivalent Circuit Models of Package Power Supply Distribution Systems from Full Wave EM Field Simulations," © 1998 IEEE, pp. 167–170.

Fan et al., "Incorporating Vertical Discontinuities in Power–Bus Modeling using a Mixed–Potential Integral Equation and Circuit Extraction Formulation," © 1998 IEEE, pp. 171–174.

Zhao et al., "Effects of Power/Ground via Distribution on the Power/Ground Performance of C4/BGA Packages," © 1998 IEEE, pp. 177–180.

Novak, "Reducing Simultaneous Switching Noise and EMI on Ground/Power Planes by Dissipative Edge Termination," © 1998 IEEE, pp. 181–184.

Herrell et al., "Modeling of Power Distribution Systems in PCs," © 1998 IEEE, pp. 159–162.

Chen et al., "Modeling and Simulation of Thin Film Decoupling Capacitors," © 1998 IEEE, pp. 205–208.

Diaz–Alvarez et al., "Power Decoupling with Integral Capacitors and Area Array Connections," © 1998 IEEE, pp. 209–212.

Roy et al., "ESR and ESL of Ceramic Capacitor Applied to Decoupling Applications," © 1998 IEEE, pp. 213–216.

Fang et al., "Modeling of the Electrical Performance of the Power and Ground Supply for a PC Microprocessor on a Card," © 1998 IEEE, pp. 116–119.

Shi et al., "An Experimental Procedure for Characterizing Interconnects to the DC Power Bus on a Multilayer Printed Circuit Board," IEEE Transactions on Electromagnetic Compatibility, vol. 39, No. 4, Nov. 1997, pp. 279–285.

Van den Berghe et al., "Study of the Ground Bounce caused by Power Plane Resonances," IEEE Transactions on Electromagnetic Compatibility, vol. 40, No. 2, May 1998, pp. 111–119.

Moran et al., "Application of the Finite–Difference Time –Domain Method and Measurement of Split Ground Plane Structures in Mixed Signal Integrated Circuits and Packages," May 1999, 2 pgs.

Lescot et al., "Effect of a Metallic Ground Plane on Advanced CMOS On–Chip Interconnects," May 1999, 2 pgs.

Novak, "Probes and Setup for Measuring Power–Plane Impedances with Vector Network Analyzer," Feb. 1999, pp. 201–214.

Daniele et al., "Spectral complete model for considering the effects of a finite ground plane on a PCB," 1996, pp. 226–229.

Leroux et al., "Modelling of Power Planes for Electrical Simulations," 1996, pp. 664–668.

Cai et al., "Numerical Extraction of Partial Inductance of Package Reference (Power/Ground) Planes," © 1995 IEEE, pp. 12–15.

Young, "Case Study of Ground Plane Inductance and Implications for Simulation,", IEEE Transactions on Components, Packaging, and Manufacturing Technology—Part B., vol. 18, No. I, Feb. 1995, pp. 174–178.

Peng, "Theory of Wave Guiding by Two–Dimensionally Periodic Structures: Progresses and Challenges," Aug. 1999, 1 pg.

Kelly et al., "Band Diagram for a Grounded Periodic Dielectric Substrate with Square Lattice and Finite Height," Aug. 1999, 1 pg.

Yang et al., "Fundamental Artificial–Periodic Substrate Effects on Printed Circuit Antennas," Aug. 1999, 1 pg.

Tzuang et al., "Guiding and Leaky Characteristics of Microstrip above Perforated Ground Plane," Aug. 1999, 1 pg.

Amari et al., "Simple Rules for Truncation of Periodic Structures to Achieve a Prescribed Bandcap Attenuation Level," Aug. 1999, 1 pg.

Hirano et al., "Characterization and Reduction of Simulataneous Switching Noise for a Multilayer Package," © 1994 IEEE, pp. 949–956.

Patent Abstracts of Japan, publication No. 09305649, published Nov. 28, 1997.

Brown et al., "Delta–I Simultaneous Switching," IBM Technical Disclosure Bulletin, vol. 27, No. 4A, Sep. 1984, pp. 2048–2053.

International Search Report, application No. PCT/US00/23836, mailed Dec. 13, 2000.

* cited by examiner

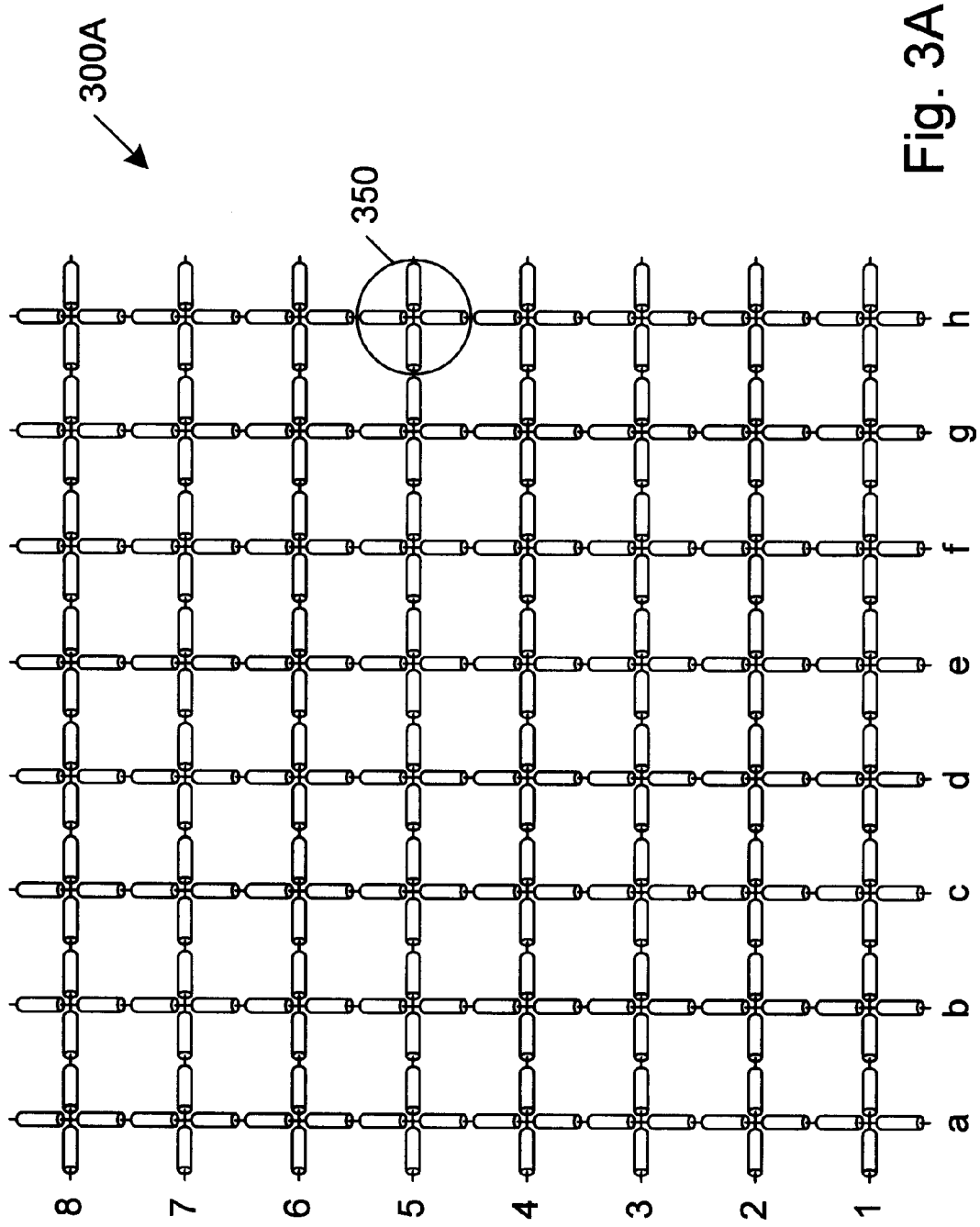

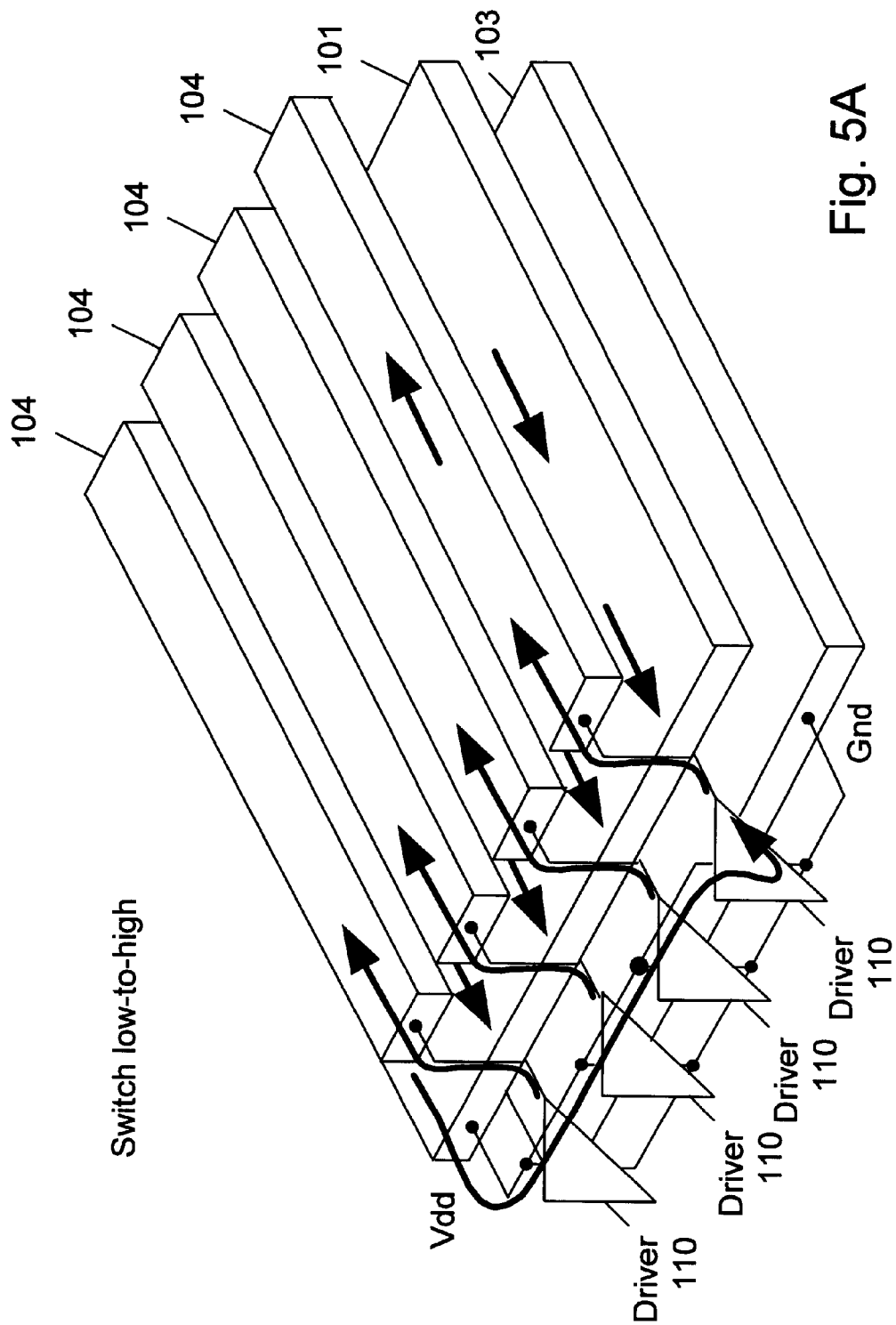

Measurement

Simulation

Measurement

50nSec/div

Simulation

SYSTEM AND METHOD FOR ANALYZING SIMULTANEOUS SWITCHING NOISE

This application claims the benefit of U.S. Provisional Application No. 60/151,535 entitled "Simultaneous Switch Noise and Power Plane Bounce for CMOS Technology", filed Aug. 31, 1999.

BACKGROUND OF THE INVENTION

1. Field of the Invention

This invention relates to analysis of electronic circuits under various conditions, and more particularly, a system and method for analyzing the effects of simultaneous switch noise (SSN) in electronic systems.

2. Description of the Relevant Art

As the density of integrated circuits increases, the problems associated with signal switching noise become greater. Many integrated circuits have a large number of input/output (I/O) drivers. Several hundred drivers may be present in some integrated circuits, and this number will undoubtedly become larger as packaging density increases in the future. Noise that occurs in an electronic system when a large number of drivers simultaneously switch from one state to another is known as simultaneous switch noise (SSN). The problem may be even more acute when the drivers all switch in the same direction (e.g. high to low). When a large number of drivers switch simultaneously, various signal integrity problems may occur. For example, SSN may result in erroneous noise pulses on signal lines, and may also alter system timing. SSN from a given chip may cause receivers of other chips in an electronic system, or receivers on the same chip, to receive incorrect results. SSN may in some cases also lead to power supply fluctuations severe enough to cause damage to the circuits comprising the load, or even internal damage to the power supply itself.

Software tools for analyzing the effects of SSN have been developed. The majority of these tools approach the SSN problem as an inductance issue. In order to analyze SSN as an inductance problem may require a number of coupled inductance matrices. Each of these matrices may include a large number of inductive elements. Due to the large number of elements, simulations involving these matrices may consume a large amount of computational resources, and have very long compute times.

It should also be noted that advanced packaging techniques have reduced the inductive aspect of the SSN problem. Many newer integrated circuit packages have their own power and ground planes. Signal traces in such packages tend to behave more like transmission lines, having distributed parameters such as impedance and delay instead of lumped parameters, such as inductance. Many packages, such as ball-grid array packages, replace traditional lead structures with solder balls that connect to a printed circuit board, further reducing inductance. In some cases, a signal path in such a package may have less than 1% of the inductance of a similar signal path in a traditional lead-frame package (e.g. a quad flat-pack with gull-wing leads).

Many prior art SSN analysis techniques fail to account for skin effect, wherein alternating current signals travel on or near the surface of a solid plane or conductor. Skin depth decreases in a manner inversely proportional to the frequency of a signal traveling on a plane or conductor. For example, at 10 kHz, the skin depth of copper is 0.66 mm, while at 100 MHz, the skin depth of copper is 0.0066 mm. Many prior art techniques treat the signal as traveling within the conductor, which may lead to a faulty analysis of the SSN problem, as it may incorrectly model current flow within the system.

Another problem with prior art SSN analysis techniques is the modeling of the attachment of a silicon driver. A silicon driver in an integrated circuit typically includes three terminals, and must be coupled to a voltage supply plane, a ground (or reference) plane, and a transmission line which carries the signal. Many prior art systems connect the voltage supply plane in series with an impedance representing a transmission line to arrive at a superimposed analysis solution for both the transmission line and the voltage supply plane. By connecting the transmission line impedance in series with the voltage supply plane, such techniques may fail to account for all of the current flowing through the driver. At best, this technique leads to an incomplete solution of the SSN analysis.

Still another problem with prior art SSN analysis techniques is the use of ideal power supplies in the simulation. An ideal power supply is a power supply that has zero output impedance. In reality, such power supplies do not exist. An ideal power supply may be configured to provide a constant voltage between its terminals regardless of the behavior of the load circuit. Thus, such analysis techniques employing ideal power supplies may fail to account for power supply fluctuations that may occur due to the simultaneous switching of a large number of drivers.

With the problems mentioned above, it has become increasingly difficult to get accurate results to simulations of the SSN problem. Often times, results from a simulation and analysis will not have any meaningful correlation to the SSN problem of hardware that is built based on such analysis. In part due to the lowered inductance associated with advanced packaging techniques, as well as the higher frequencies and number of drivers present, the SSN problem may often times be more of a plane bounce problem than an inductance problem, as it is often thought of traditionally. Thus, a different approach is necessary in order to better understand the SSN problem, and thus design hardware that effectively addresses the problem.

SUMMARY OF THE INVENTION

The problems outlined above are in large part solved by a system and method for simultaneous switch noise (SSN) analysis of electronic circuits. In one embodiment, a model may be provided for the electronic circuit to be analyzed. The electronic circuit may be an integrated circuit, a multi-chip module, a printed circuit assembly, or other type, and may in some embodiments include combinations of these types. The electronic circuit may include a plurality of drivers, each of which may be coupled to a power plane, a ground plane, and a transmission line. The connection of the driver may be accurately modeled in this manner. Each driver may be configured to switch between a logic high voltage and a logic low voltage. The modeled electronic circuit may also include a voltage source coupled to the power plane and the ground plane, a voltage regulator module, and a plurality of decoupling capacitors. The simultaneous switching of a plurality of drivers, from a logic high to a logic low, or vice versa, may be simulated. The system and method may then allow for the calculation of solutions for the transmission line and the power planes (as will be detailed below). The transmission line solution and power plane solution may be superimposed on each other, which may allow for an analysis of plane bounce, which may include one or more fluctuations in the voltage between the power plane and the ground planes.

In one embodiment, the model of an electronic circuit to be analyzed for SSN may be a mathematical model, such as a SPICE model, which may be simulated on a computer system. The model of the circuit may include a variety of components present in the circuit, including (but not limited to) resistors, capacitors, inductors, power supplies, integrated circuits, and a voltage regulator module. The power and ground planes may be modeled as a mesh of transmission lines. The model may also include a plurality of drivers configured to switch between two different logic voltage levels. The system and method for SSN analysis may be configured to simulate the simultaneous switching of a large number of these drivers from one logic voltage to the other. In some embodiments, transmission lines may be terminated with an open circuit, while in others, transmission lines may be terminated using resistors.

In one embodiment, a transmission line solution may be obtained from analysis of voltage waves and current waves propagating from each driver. A first voltage wave and a first current wave may propagate from the drivers involved in the simultaneous switching to a power plane in the circuit. A second voltage wave and a second current wave may propagate from the drivers to a ground plane. A power plane solution may be obtained by analyzing electrical charge accumulating on both the power and ground planes of the circuit, as well as a third voltage wave and a third current wave propagating radially from each driver. The transmission line solution may be superimposed with the power plane solution in order to produce a final solution. A final solution may include an analysis of plane bounce as described above.

The SSN analysis may be affected by the arrangement of transmission lines with respect to the power and ground planes in various embodiments. In one embodiment of an electronic circuit, transmission lines may be arranged above a power plane, which may in turn be arranged above a ground plane. In other embodiments, transmission lines may be arranged between the power plane and ground plane. Some embodiments may also include multiple power and ground planes stacked on top of one another, with transmission lines arranged above, below, or between the various layers of power and ground planes. When transmission lines are arranged between a power and ground plane, transmission line solutions may be calculated by modeling each transmission line as two independent transmission lines, obtaining and independent solution for each independently modeled transmission line, and superimposing their solutions upon one another.

Thus, in various embodiments, the system and method described herein may allow for a more accurate analysis of the SSN problem. In particular, plane bounce may be more accurately analyzed. The system and method for SSN analysis may be used in conjunction with other circuit design tools. For example, the system and method for SSN analysis may be used in conjunction with design tools for determining decoupling capacitors in an electronic circuit. Furthermore, by analyzing the problem as a plane bounce problem, many of the inductances and mutual inductances that were accounted for during traditional SSN analysis methods may be eliminated from the analysis of the method described herein. This may result in a significant reduction in computation time.

BRIEF DESCRIPTION OF THE DRAWINGS

Other objects and advantages of the invention will become apparent upon reading the following detailed description and upon reference to the accompanying drawings in which:

FIG. 3A is a diagram of one embodiment of a transmission line mesh used to model the ground and power planes;

FIG. 5A is an illustration of the current flow between the driver, transmission lines, power plane, and ground plane for one embodiment of an electronic circuit following a simultaneous switching from a logic low voltage to a logic high voltage;

Figure 1:
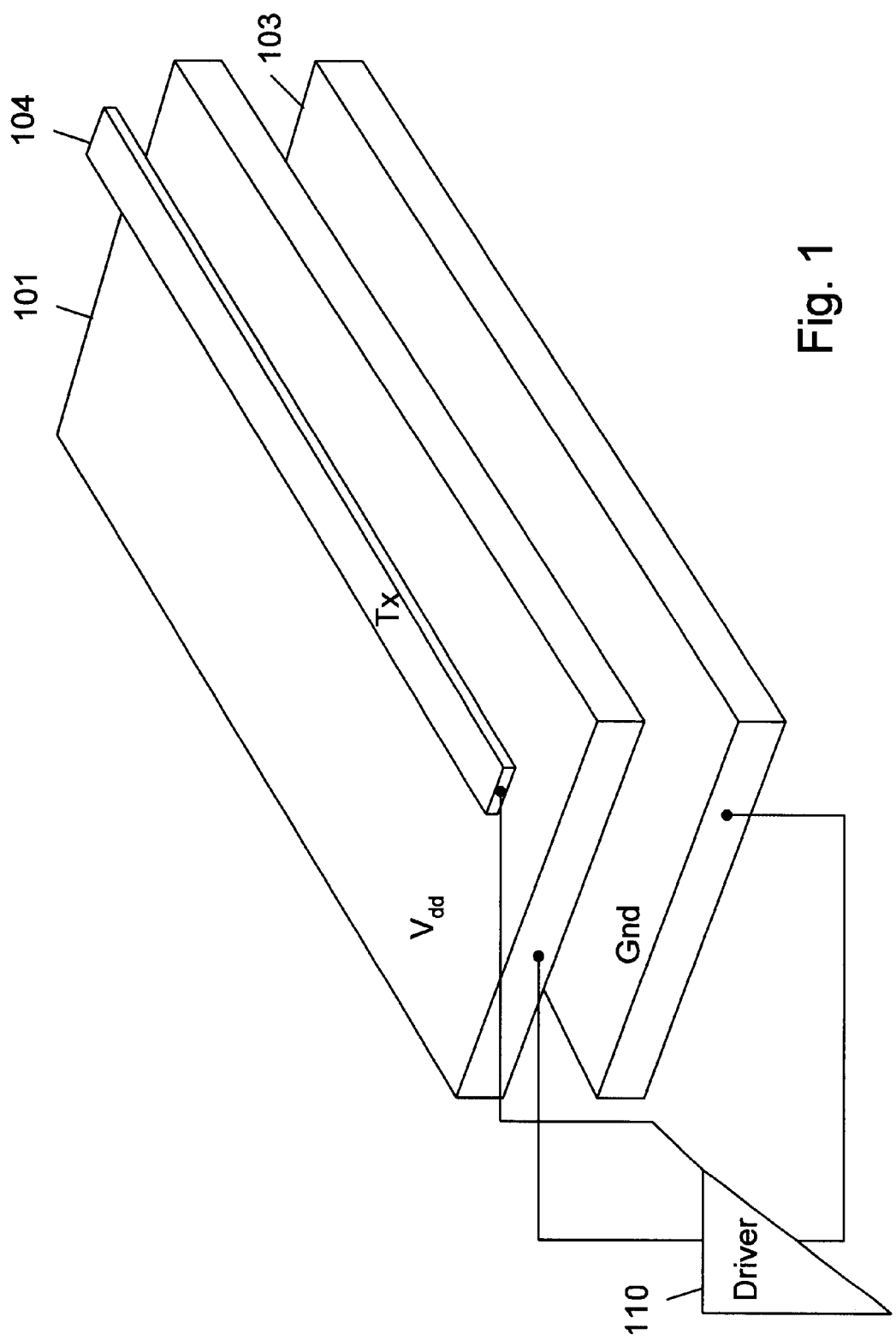
FIG. 1 is a drawing illustrating one embodiment of a configuration of a driver connection to a power plane, a ground plane, and a transmission line.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE PREFERRED EMBODIMENTS

Turning now to FIG. 1, is a drawing illustrating one embodiment of a configuration of a driver connection to a power plane, a ground plane, and a transmission line is shown. Driver 110 is coupled to power plane 101, ground plane 103, and transmission line 104. The connection of driver 110 to power plane 101, ground plane 103, and transmission line 104 may be modeled as shown here when performing simultaneous switch noise (SSN) analysis. The accurate modeling of this connection may allow for more accurate accounting of currents flowing to or from the driver during operation of the electronic circuit in which they are implemented, as current flow through each of the three driver terminals may be accounted for.

Driver 110 is configured for switching between two different logic voltage levels (e.g. 5 volts and 0 volts) and driving logic signals at these voltages onto transmission line 104. Driver 110 may be part of a logic circuit, and may further be part of an integrated circuit.

In the embodiment shown, transmission line 104 is arranged above power plane 101, which in turn is arranged above ground plane 103. Other embodiments with alternate arrangements are possible and contemplated. In one alternate embodiment, transmission line 104 may be arranged between ground plane 103 and power plane 101. In further alternate embodiments, multiple ground and power planes may be present, with transmission lines arranged above, below, or between. Regardless of the arrangement of transmission lines with respect to ground and power planes, mutual coupling (inductive and/or magnetic) between the transmission lines and power/ground planes may be insignificant due to skin effect. This may enable transmission line solutions to calculated for transmission lines above a power/ground plane and transmission lines below the same power/ground plane. These transmission line solutions may be superimposed upon each other. Transmission line solutions will be discussed in further detail below.

Figure 2A:
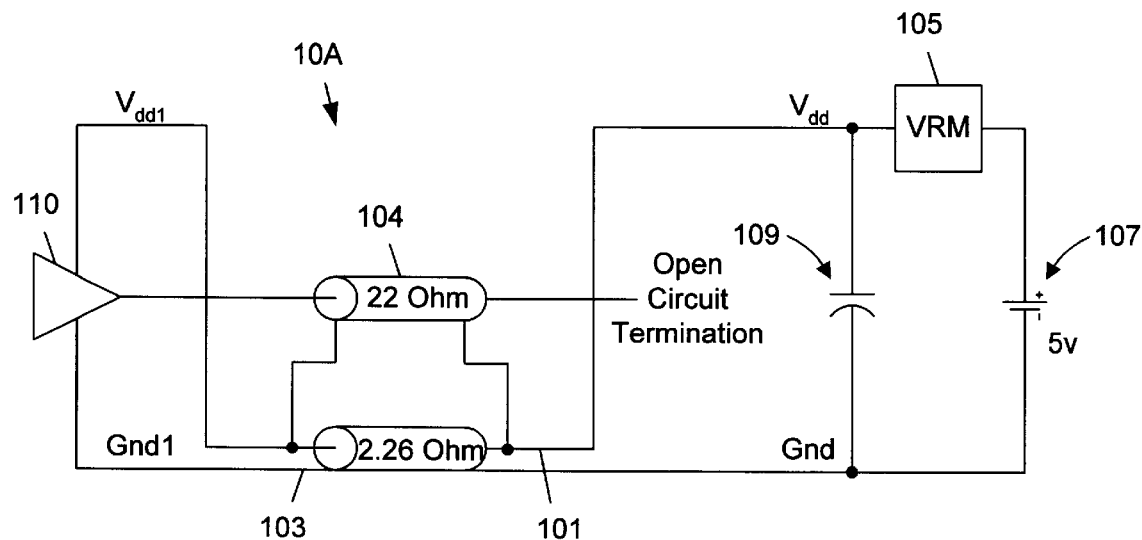
FIG. 2A is a schematic diagram illustrating one embodiment of a circuit model used for simulating the simultaneous switch noise problem, wherein the transmission lines are terminated with an open-circuit.
Figure 2B:
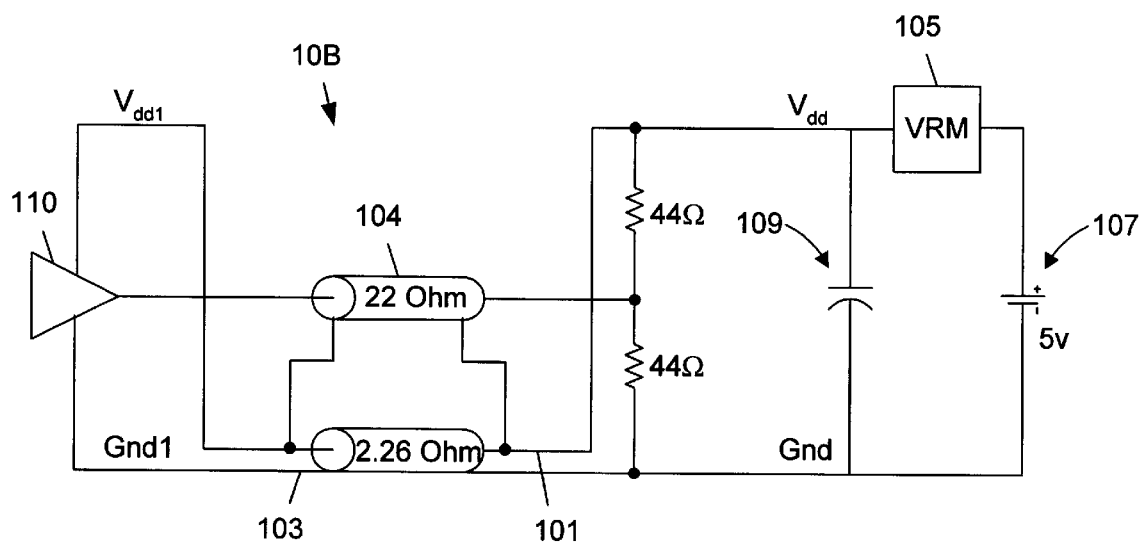
FIG. 2B is a schematic diagram illustrating one embodiment of a circuit model used for simulating the simultaneous switch noise problem, wherein the transmission lines are terminated with resistors.

FIGS. 2A and 2B are schematic diagrams of embodiments of circuit models that may be used with the method of SSN analysis. Embodiments other than those shown here are possible and contemplated. Circuit model 10A may be a schematic of a generalized circuit model used for SSN analysis. The schematic shown here may represent a mathematical circuit model, and more specifically, may be a SPICE model. A computer system may be used to simulate operation of the circuit using the mathematical model. The computer system may also be used to calculate transmission line solutions, power plane solutions, and plane bounce by superimposing the transmission line and power plane solutions on each other.

Circuit model 10A includes a model of silicon driver 110, which may be configured for switching between a logic high voltage level and a logic low voltage level. Although only one driver is included in the embodiment shown, models for specific electronic circuit may include a hundreds or even thousands of drivers.

Driver 110 is coupled to a model of transmission line 104 in the embodiment shown, which is modeled as having an impedance of 22 ohms. It should be noted that transmission lines with other impedance values are possible and contemplated, and these transmission lines may be of several different types. Examples of different types of transmission lines include a trace on a printed circuit board, a signal path in an integrated circuit, a wire, a lead on an integrated circuit package, or any other type of conductor used for conveying signals in an electronic circuit. Furthermore, it should also be noted that various embodiments of circuit model 10A may include a large number of transmission lines, and some of these may be of different types (and thus different impedances) than others.

Circuit model 10A includes models of both power plane 101 and ground plane 103. In the embodiment shown, power plane 101 and ground plane 103 are modeled as a transmission line with an impedance of 2.26 ohms. Power plane 101 and ground plane 103 may be further modeled as a mesh of transmission lines (as will be explained in further detail below) with a larger, smaller, or equal impedance to the power/ground planes shown in this embodiment. In some embodiments, multiple power and ground planes may be present.

In the embodiment shown, circuit model 10A includes voltage source 107 and voltage regulator module (VRM) 105. Voltage source 107 may be configured as a power source for an electronic circuit modeled by circuit model 10A. Voltage source 107 is modeled here as providing 5 VDC to the circuit, although other voltages are possible and contemplated. Furthermore, multiple voltage sources may be present in some circuits, and thus various embodiments of circuit model 10A (or 10B) may reflect this. VRM 105 may be configured for providing a smooth, steady voltage to the electronic circuit modeled by circuit model 10A, and in some embodiments, may convert a voltage into another voltage (e.g. 5 volts to 1.8 volts).

Also shown in circuit model 10A is a model of capacitor 109. In the embodiment shown, capacitor 109 may be a decoupling capacitor. The modeling of capacitor 109 may include the total capacitance of all decoupling capacitors in the electronic circuit upon which circuit model 10A is based. Furthermore, in some embodiments, the modeling of capacitor 109 may incorporate other electrical characteristic of the decoupling capacitors present in the electronic circuit. Such electrical characteristics include (but are not limited to) equivalent series resistance (ESR) and any inductance provided by the capacitors.

Circuit model 10B shown in FIG. 2B is identical to circuit model 10A of FIG. 2A, with the exception of the termination of the transmission lines. In circuit model 10A, transmission line 104 is terminated with an open circuit. In contrast, transmission line 104 of circuit model 10B is terminated with a pair of resistors, one between transmission line 104 and power plane 101, and the other between the transmission line 104 and ground plane 103. The method of termination of transmission lines may have a significant effect on the plane bounce problem that may result from the simultaneous switching of drivers, as will be further discussed in reference to FIGS. 6A and 6B. In the embodiment shown, 44 ohm resistors are used, although other values may be used in various embodiments. Some electronic circuits may include a combination of transmission lines, with some that are open-circuit terminated, and others that are resistor terminated. Circuit models based on such electronic circuits are possible and contemplated.

Moving now to FIG. 3A, diagram of one embodiment of a transmission line mesh used to model the ground and power planes is shown. Power plane 101 and ground plane 103 of FIGS. 1, 2A, and 2B may each be modeled as a mesh of transmission lines. As shown, the model includes a grid 300A of transmission line segments. These segments may be grouped into cells, such as cell 350. As shown, there are eight columns labeled "a" through "h" as well as eight rows labeled, from bottom to top, labeled "1" through "8". The model may be in the form of a mathematical array (such as a SPICE array) of transmission lines in a fixed topology, such as the 8×8 grid shown in this embodiment. The transmission lines may be of variable lengths such that the fixed topology may be used on an electrical interconnecting device of any physical dimensions. Embodiments of a larger or smaller size are possible and contemplated, as are embodiments employing different geometries (such as a "wheel and spoke" geometry).

Figure 3B:
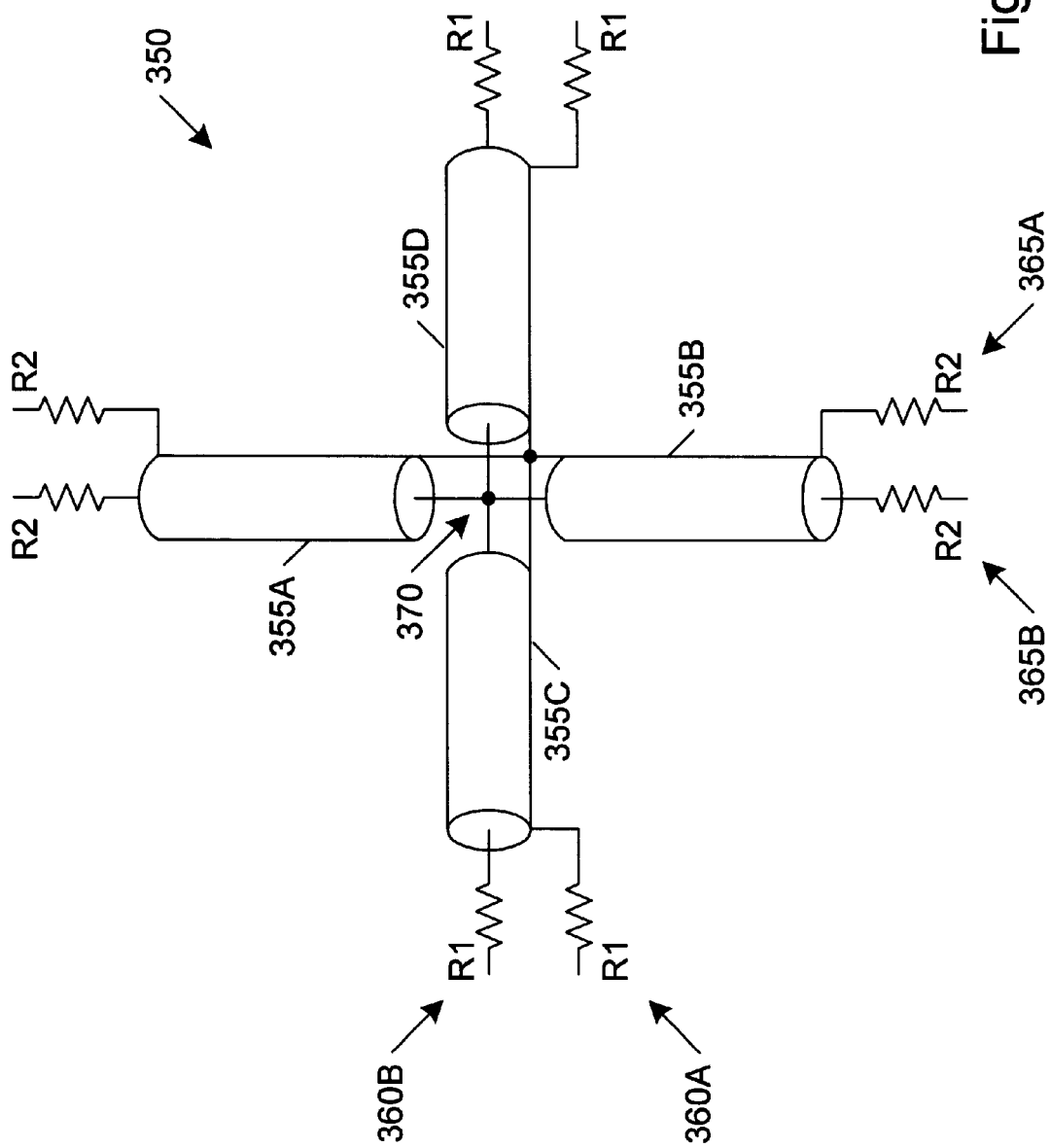
FIG. 3B is a drawing of one embodiment of a unit cell in the transmission line mesh shown in FIG. 3A.

FIG. 3B is a drawing of one embodiment of a unit cell in the transmission line mesh shown in FIG. 3A. In the embodiment shown, unit cell 350 includes four transmission lines, 355A–355D. The four transmission lines are connected at node 370. As shown in this embodiment, connections to the center conductors represent plane 1, while connections to shield are plane 2. Note that the model is balanced, therefore either plane 1 or plane 2 may be power or ground, as desired. Transmission lines 355A and 355B are preferably described with a width impedance "$Z_W$" and a width time delay "$t_{DW}$". Transmission lines 355C and 355D are preferably described with a length impedance "$Z^L$" and a length time delay "$t_{DL}$". $R_1$ and $R_2$ are resistances. The constants, parameters and variables of interest, as well as the equations that define and relate these quantities, along with the preferred units are given below:

"L" is the length of the plane (inches)

"W" is the width of the plane (inches)

"thk" is the thickness of the dielectric (mils)

"cu" is the metalization thickness (mils)

"velc" is the speed of light in a vacuum (inches/sec)

"hertz" is the frequency variable

"$\in_0$" is the vacuum dielectric constant (permittivity) (picofarads/inch)

"$\in_r$" is the dielectric constant

"σ" is the copper conductivity (per ohm/mils)

"$\mu_0$" is the permeability of a vacuum (henries/mil)

"vel" is the velocity of a signal on the electrical interconnecting apparatus $$vel = velc/\sqrt{\in_r}$$

"n" is the size of the grid, i.e. 8 as shown

"asp" is the aspect ratio of the grid, asp=L/W

"factor" is a calibration factor to compensate for capacitive loading $$factor = 1/\sqrt{2}$$

"$t_{FL}$" is the time of flight for the length dimension, $t_{FL}=L/vel$

"$t_{FW}$" is the time of flight for the width dimension, $t_{FW}=W/vel$

"$t_{DL}$" is the transmission line delay time for the length dimension $$t_{DL} = t_{FL}/(2n) \text{factor}$$

"$t_{DW}$" is the transmission line delay time for the width dimension $$t_{DW} = t_{FW}/(2n) \text{factor}$$

"cap" is the parallel plate capacitance of the plane $$cap = (\in_0 \in_r LW)/(10^{-9} thk)$$

"$Z_L$" is the impedance in the length direction

"$Z_W$" is the impedance in the width direction, $Z_W = Z_L/\text{asp}$ $$Z_L = (n/cap)(t_{FL} + asp \cdot t_{FW}) \text{factor}$$

"$R_1$" is the smaller of:

$$R_{1A} = ((L/W)/2) \cdot (1/(\sigma \cdot (1/\sqrt{hertz \cdot \pi \mu_0 \sigma})))$$

$$R_{1B} = ((L/W)/2) \cdot (1/(\sigma \cdot cu))$$

"$R_2$" is the smaller of:

$$R_{2A} = ((W/L)/2) \cdot (1/(\sigma \cdot (1/\sqrt{hertz \cdot \sigma \mu_0 \sigma})))$$

$$R_{2B} = ((W/L)/2) \cdot (1/(\sigma \cdot cu))$$

The model may represent an electrical interconnecting apparatus, which may be, for example, a printed circuit board (PCB), a semiconductor device package substrate, or an integrated circuit substrate. The method for performing SSN analysis may include creating a model of the power and ground planes based upon an M×N grid for both the power plane and the ground plane. The model is may be based upon a fixed grid that adapts automatically to the actual physical dimensions of the electrical interconnecting apparatus.

Figure 4:
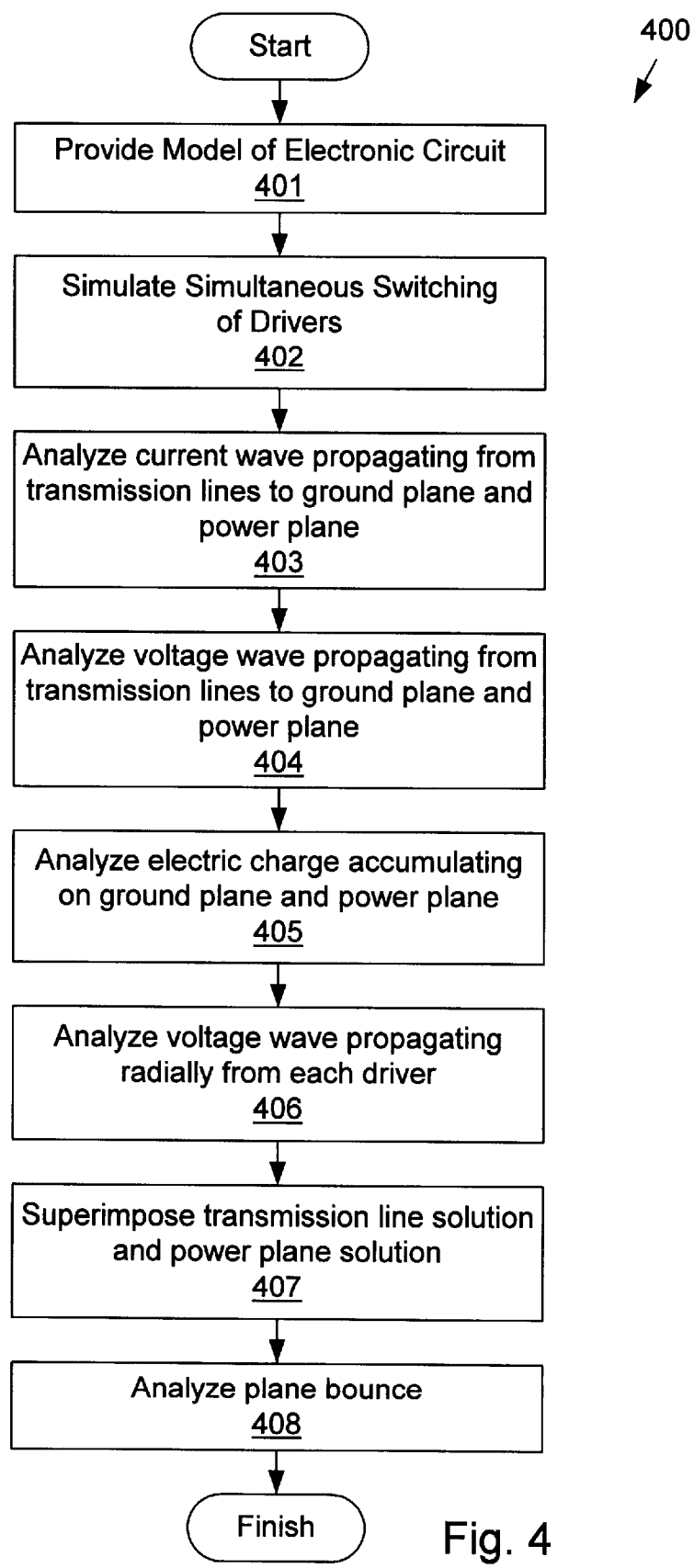
FIG. 4 is a flow diagram for one embodiment of the method for analyzing simultaneous switching noise.

Moving now to FIG. 4, a flow diagram for one embodiment of the method for analyzing simultaneous switching noise is shown. SSN analysis method 400 begins with the providing of a model of an electronic circuit (Step 401). The model may be a mathematical model of an electronic circuit, and further, may be a SPICE model. The electronic circuit for which SSN analysis is to be performed may be modeled using the techniques described in reference to FIGS. 1–3B.

In Step 402, the method may simulate the switching of a large number of drivers in the electronic circuit. The drivers may all switch in the same direction, from either a logic high to a logic low, or a logic low to a logic high. In the circuit being simulated, the simultaneous switching of a large number of drivers in the same direction may cause plane bounce, which may include a number of voltage fluctuations between a power plane and a reference (e.g. ground) plane.

In Steps 403 and 404, a transmission line solution may be calculated. Step 403 includes the analysis of current waves which may propagate from each transmission line associated with a switching driver. When a given driver switches from one logic voltage to the other, it may cause a voltage wave and a current wave to propagate between a transmission line and a reference plane (either the ground plane or power plane). In some cases, the current waves may propagate between the transmission line and both the power and ground plane. In many situations, the current wave may propagate from the transmission line, through the driver, and onto the nearest reference plane. For example, using the arrangement illustrated in FIG. 1, a current wave resulting from the switching of the driver may propagate from the transmission line onto the power plane, as it is nearest to the transmission line. It should be noted that the current wave may comprise either positive current or negative current, based on the direction of switching by the driver and the voltage of the transmission line relative to the reference plane. More detailed descriptions of the current flow that results from the switching of drivers will be given below.

In Step 404, a voltage wave coinciding with the current wave described above may be analyzed. As with the current wave, the voltage wave may comprise either a positive or negative voltage (with respect to the reference plane), and may be base on the direction of switching for the drivers involved in the simulation.

One problem that may arise in the calculation of a transmission line solution may occur when transmission lines are arranged between power and ground planes. In such situations, the transmission line may be an equal distance, or near equal distance from both the power and ground planes. Thus, it may not be initially clear as to which plane a given transmission line should be referenced, as both may be affected by the voltage and current waves propagating from the transmission line. This problem may be solved by modeling the transmission line as two independent transmission lines, with one referenced to the power plane and one referenced to the ground plane. In such cases, separate transmission line solutions may be calculated for each of the two independently modeled transmission lines. These separate transmission line solutions may then be superimposed upon each other to obtain a single transmission line solution.

It should also be noted that the exact geometry of the transmission line is not important in calculating the transmission line solution. The accounting of current flow to or from a transmission line may only require knowledge of the transmission line's starting point, ending point, length, and impedance.

In Steps 405 and 406, a power plane solution may be obtained. In Step 405, analysis of electrical charge accumulating on the power and ground planes may be performed. The accumulation of charge on both the power and ground plane may be a result of the switching of a driver and the resulting current flow. During operation of the electronic circuit, the power and ground planes may behave as two parallel plates of a capacitor. In the arrangement illustrated in FIG. 1, if driver 10 switches from a logic high voltage to a logic low voltage, it may begin drawing positive current from transmission line 104. Since the transmission line is referenced to power plane 101 (the nearest reference plane), and equal and opposite current may begin flowing from power plane 101. This may result in a depletion of positive charge on power plane 101 in the vicinity of the connection to driver 110, and thus, an accumulation of negative charge. At the same time, positive current may be flowing from driver 110 into ground plane 103, which may result in an accumulation of positive charge on ground plane 103. With an accumulation of negative charge on power plane 101 and positive charge on ground plane 103, the voltage between these two planes may change according to the formula Q=CV, wherein Q represents the amount of electrical charge, C represents the capacitance between the planes, and V is the resulting voltage change. Solving for the voltage, the equation may be rearranged as V=Q/C. Thus, plane bounce may be described as the changing voltage between the power and ground planes.

It should be noted that an equivalent action may occur when the driver is referenced to ground and the driver switches from a logic low voltage to a logic high voltage. Furthermore, if a transmission line is arranged between two planes, charge may accumulate on both planes regardless of the direction in which the driver switches, thereby resulting in plane bounce. The accumulation of charge on the planes may be accounted for in Step 405 of method 400.

Step 406 may include the analysis of a voltage wave propagating radially from each driver involved in the simultaneous switching. When a driver switches from one logic voltage to another logic voltage, a voltage wave may propagate from it in a radial fashion onto the power plane, ground plane, and transmission line. The speed at which the voltage wave propagates may be determined by dividing the speed of light by the square root of the permitivity of the medium (e.g. copper) of the material of the planes and transmission lines. The voltage wave may affect the accumulation of charge on the power and ground planes as well as the current flowing to or from a transmission line connected to a driver that has switched.

In Step 407, the transmission line solution (Steps 403 and 404) and a power plane solution (Steps 405 and 406) may be superimposed upon each other to obtain a final plane bounce solution. Plane bounce may comprise one or more voltage fluctuations between a power plane and a ground plane. If the voltage fluctuations are large enough in magnitude, they may in some cases be able to cause inadvertent switching of various drivers in the circuit, which in turn may lead to erroneous operation.

Plane bounce may be analyzed in Step 408. In one embodiment, the data obtained by superimposing the transmission line solution with the power plane solution may be presented in a graphical format. Other embodiments, wherein the data is presented numerically are possible and contemplated. Examples of graphically presented plane bounce data will discussed below in reference to FIGS. 6A and 6B.

Figure 5B:
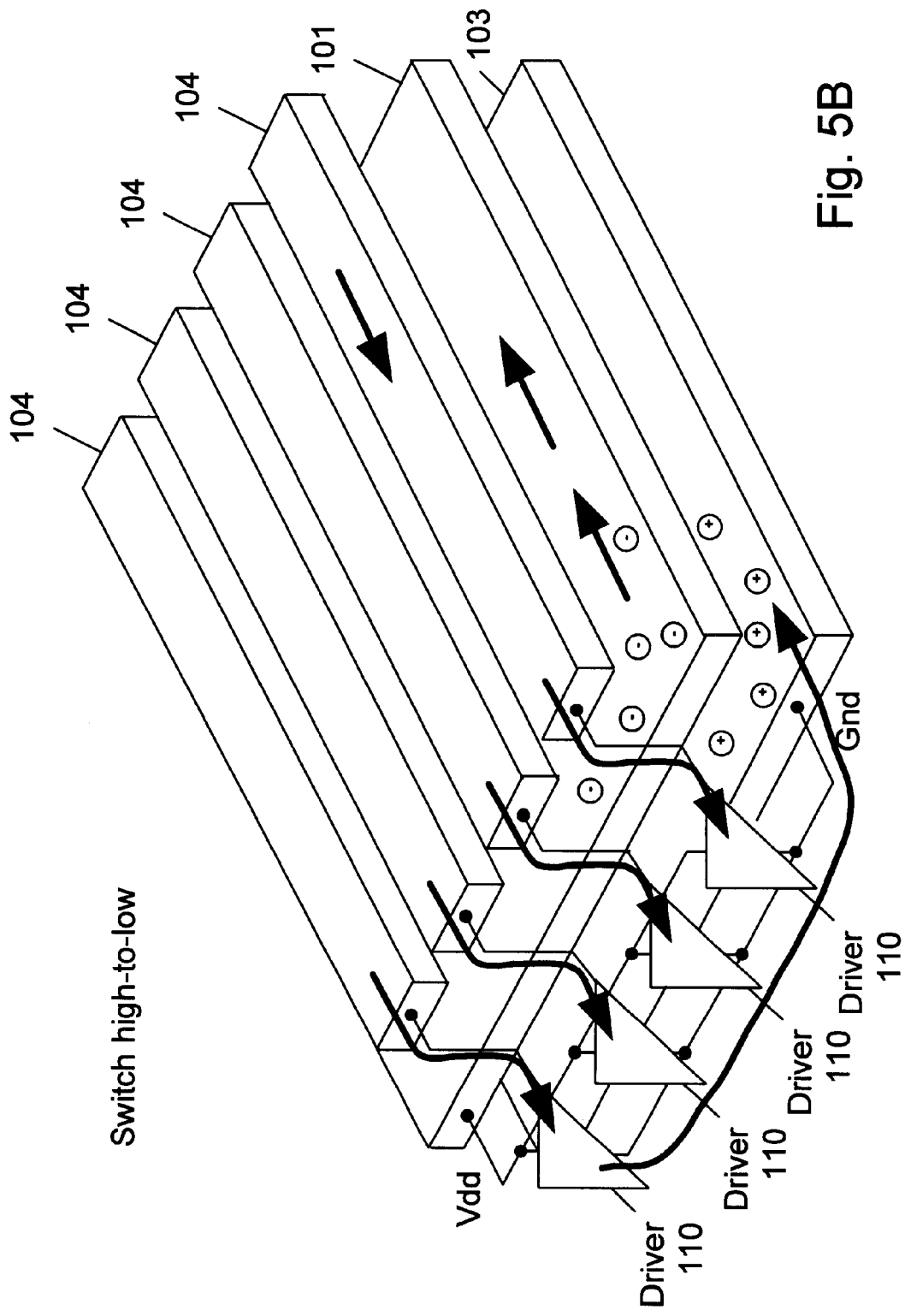
FIG. 5B is an illustration of the current flow between the driver, transmission lines, power plane, and ground plane for one embodiment of an electronic circuit following a simultaneous switching from a logic high voltage to a logic low voltage.

Turning now to FIG. 5A, an illustration of the current flow between the driver, transmission lines, power plane, and ground plane for one embodiment of an electronic circuit following a simultaneous switching from a logic low voltage to a logic high voltage is shown. This example, along with that shown in FIG. 5B, may illustrate how the arrangement of transmission lines with respect to power and ground planes, the direction of switching, and method of transmission line termination may affect the plane bounce resulting from SSN. The transmission lines in this embodiment may be terminated with an open circuit. In the embodiment shown, each of drivers 110 has simultaneously switched from a logic low to a logic high. As indicated by the arrows, current may be drawn from power plane 101, through each of drivers 110, and onto transmission lines 104, which are initially at a lower potential than power plane 101. As the current wave propagates down each of transmission lines 104, electrical charge may flow into the capacitance existing between the transmission lines and power plane 101. Eventually, the potential of the transmission line may rise to a voltage at or near the potential of power plane 101. The capacitance existing between transmission lines 104 and power plane 101 may complete the current path, and since ground plane 103 is not immediately under transmission lines 104, it may be relatively undisturbed by the simultaneous switching of drivers 110. Thus, in this case, plane bounce may be minimal, if any occurs at all.

FIG. 5B is an illustration of the current flow between the driver, transmission lines, power plane, and ground plane for one embodiment of an electronic circuit following a simultaneous switching from a logic high voltage to a logic low voltage. The embodiment shown here is identical to that of FIG. 5A, with each of transmission lines 104 terminated with an open circuit. In this case, each of drivers 104 has simultaneously switched from a logic high to a logic low. Immediately prior to the switching, each of transmission lines 104 may be at or near the potential of power plane 101. Following the switching, current may flow out of transmission lines 104, through drivers 110, and into ground plane 103. Current flowing into ground plane 103 may result in an accumulation of positive charge near the connections to each of drivers 110. While current flows into ground plane 103 from drivers 110, current may be flowing away from drivers 110 on power plane 101, resulting in accumulations of negative charge near each driver connection. The current path may be completed by the decoupling capacitance in the vicinity of drivers 110 between power plane 101 and ground plane 103.

The accumulation of negative charge on power plane 101 and positive charge may result in a tendency for the voltage between these planes to initially decrease. Due to the higher frequencies of many modem electronic systems (>100 MHz for system boards, up to and in excess of 2 GHz for some chips), some discrete capacitors may be unable to respond to the edge rates of switching signals due to series inductance. Thus, decoupling capacitors in such cases may be unable to suppress the initial voltage fluctuation between the power and ground planes. The charging and discharging of these capacitors may result in further voltage fluctuations between the power and ground planes.

Figure 6A:
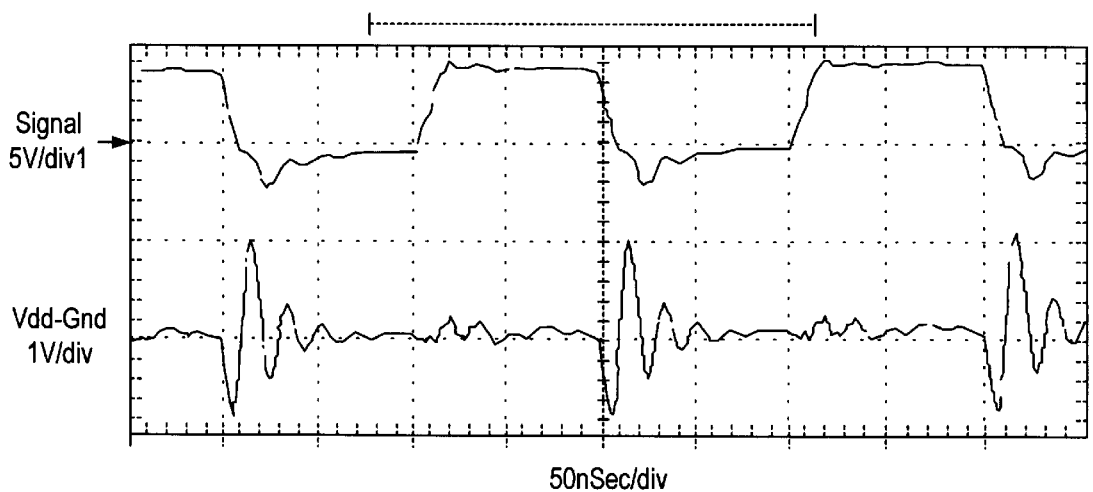
FIG. 6A is a graphical illustration of results of simultaneous switching for an electronic circuit wherein the transmission lines are terminated with an open circuit, using one embodiment of the method for simultaneous switch noise analysis.
Figure 6A:
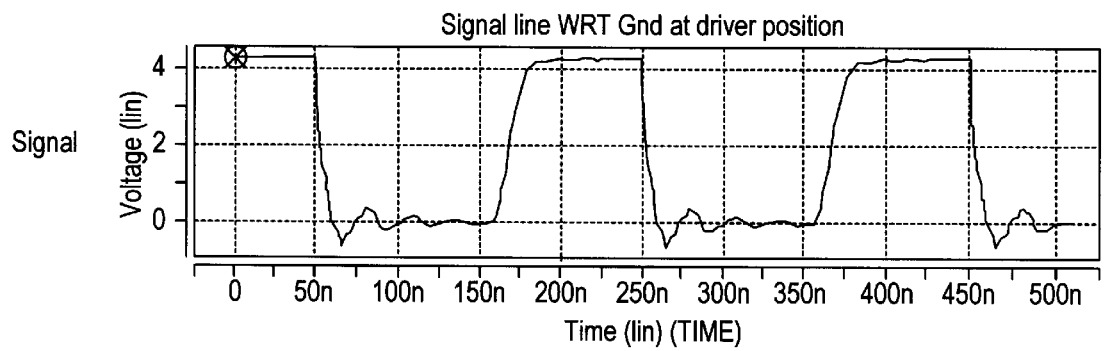
Figure 6A:
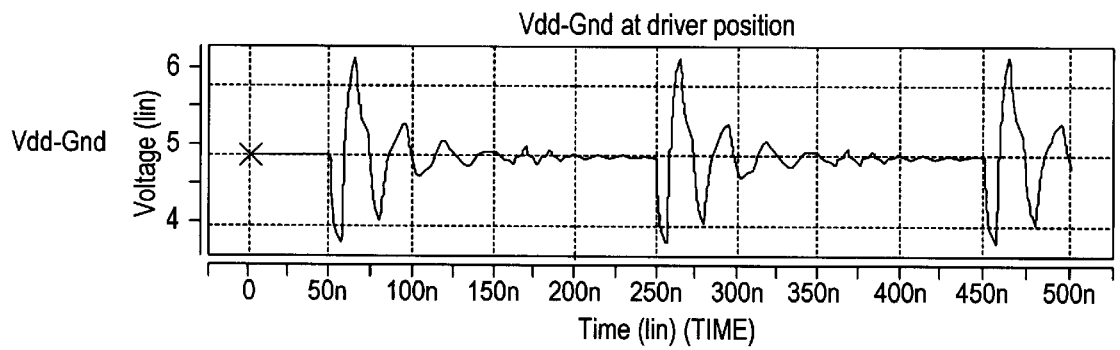

Moving now to FIG. 6A, a graphical illustration of results of simultaneous switching for an electronic circuit wherein the transmission lines are terminated with an open circuit, using one embodiment of the method for simultaneous switch noise analysis is shown. In FIG. 6A, results from both simulated and measured data are presented. The circuit used for these results included four 22-ohm transmission lines, each coupled to a driver, as well as power and ground planes. The model of the circuit used in the simulation was similar to the model presented in FIG. 2A, with the transmission lines terminated by an open circuit.

Graphical displays of both the simulated and measured results show that the simulated results, obtained by computer, were able to reasonably predict the behavior of the actual electronic circuit. Switching from a logic low to a logic high produced a relatively small amount of plane bounce. In contrast, switching from a logic high to a logic low resulted in a significant amount of plane bounce. Current flow in the circuit following the simultaneous switching of the drivers was similar to that described in reference to FIGS. 5A and 5B. In the results shown, the maximum peak-to-peak value of the plane bounce was greater than two volts in the simulated case, and approximately two volts in the measured case.

Figure 6B:
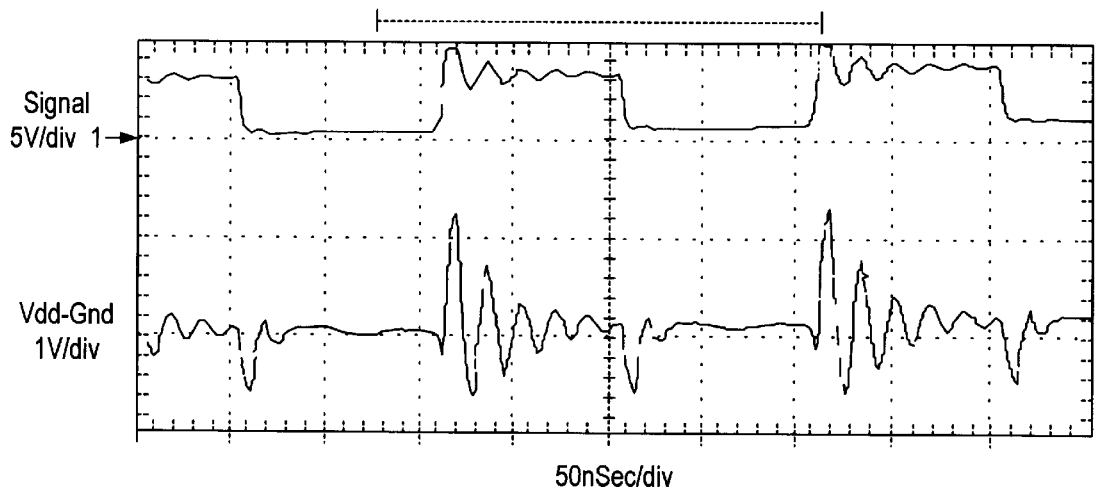
FIG. 6B is a graphical illustration of results of simultaneous switching for an electronic circuit wherein the transmission lines are terminated with resistors, using one embodiment of the method for simultaneous switch noise analysis.
Figure 6B:
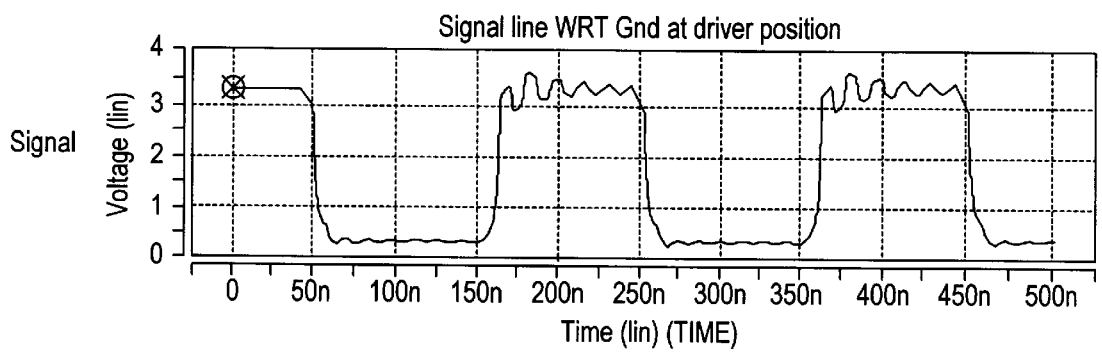
Figure 6B:
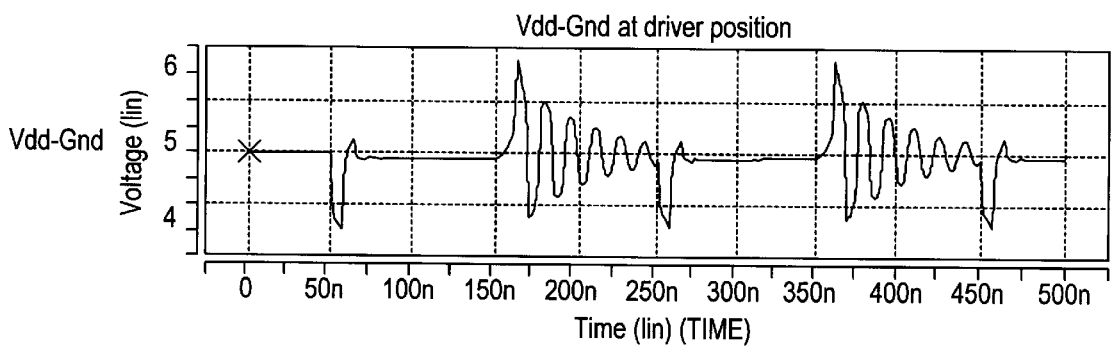

Several different methods may be used to determine the plane bounce shown in FIGS. 6A and 6B. Both time and frequency domain methods used. These methods include, but are not limited to, finite difference time domain (FDTD), finite element analysis, frequency domain impedance analysis, and meshes of resistors, inductors, and capacitors (RLC meshes). In one embodiment, meshes of transmission lines (as illustrated in FIG. 3A) may be used, as they may be readily available in many SPICE simulation tools, and may be effective at solving non-linear problems involving silicon drivers. Other embodiments using other methods of obtaining the plane bounce solution are possible and contemplated.

FIG. 6B is a graphical illustration of results of simultaneous switching for an electronic circuit wherein the transmission lines are terminated with resistors, using one embodiment of the method for simultaneous switch noise analysis. The circuit used for these results was identical to the circuit used for the example of FIG. 6A, with the exception that the transmission lines were terminated with 44 ohm resistors. The model of the circuit used in the simulation was based upon the model of FIG. 2B.

Prior to the switching of the drivers from a logic high to a logic low, current may flow from the power plane, through the transmission line, and to ground through the 44 ohm termination resistor connected between the transmission line and ground. Upon switching from a logic high to a logic low, the circuit behavior is similar to that described for the circuit in FIG. 5B. Following the switching of the driver, a voltage and current wave may propagate through the transmission line, as the potential on the line moves towards ground. Current flow may decrease through the 44 ohm resistor connected to the ground plane, while current flow may increase through the resistor connected to the power plane. As positive current flows from the power plane through the resistor, negative charge may begin accumulating on the power plane in the vicinity of the connections for those drivers that have switched. The accumulation of negative charge on the power plane may be accompanied by an accumulation of positive charge on the ground plane. As a result, the potential difference between the power plane and the ground plane may experience a momentary drop, as shown for both the measured and simulated cases. In the cases shown here, the drop in potential difference between the power plane and ground plane was slightly more than a half-volt. After a momentary increase in potential between the planes (less than one-quarter volt, as shown in both the measured and simulated cases), the voltage between power and ground becomes steady and smooth at approximately 5 volts.

Thus, there may be little simultaneous switching noise resulting from the high-to-low switching in the case where the transmission lines are terminated with resistors, as predicted by the simulation. It should be noted that the noise here is significantly less than the noise produced by the high-to-low transition for the circuit simulated in reference to FIG. 6A, wherein the transmission lines were open-circuit terminated. This may be in part due to the fact that the termination resistors may complete the current path, unlike that for the case of the open circuit termination, which may rely upon the power-to-ground capacitance to complete the current path.

For the low-to-high transition, the simulation may predict a greater amount of noise for the resistor-terminated circuit (as compared to the case for open-circuit termination). Prior to the low-to-high transition, current may flow from the power plane, through the 44 ohm resistor (between the power plane and transmission line), and through the transmission line to ground. With these initial conditions, the driver may make a low-to-high transition. The transmission line may then "snap" from a potential near ground to the potential of the power plane. Following the transition of the transmission line from a logic low to a logic high voltage, charge may begin to leave the ground node of the driver, which may result in the potential of the ground plane becoming more negative with respect to the power plane. Charging and discharging of decoupling capacitance between the power and ground planes may result in several oscillations of the potential between them.

The graphical displays for this case, as shown in FIG. 6B, show that the simulated results were able to reasonably predict the measured results. The circuit simulated in FIG. 6B showed relatively little plane bounce for the high-to-low transition and a significant amount of plane bounce for the low-to-high transition.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for analyzing simultaneous switching noise in an electronic circuit, the method comprising:
   providing a model of an electronic circuit, said electronic circuit including:
      a plurality of drivers, each of said drivers coupled to a power plane, a ground plane, and a transmission line;
      a voltage source coupled to said power plane and said ground plane, wherein said voltage source is configured to provide a specified voltage between said power plane and said ground plane; and
      a plurality of decoupling capacitors;
   simulating simultaneous switching of a two or more of said drivers from a first voltage level to a second voltage level;
   calculating a transmission line solution;
   calculating a power plane solution;
   superimposing said transmission line solution and said power plane solution; and
   analyzing plane bounce, wherein said plane bounce comprises one or more voltage fluctuations between said power plane and said ground plane.

2. The method as recited in claim 1, wherein said transmission line solution comprises analysis of a first current wave and first voltage wave propagating between said transmission line and said power plane and a second voltage wave and a second current wave propagating between said transmission line and said ground plane.

3. The method as recited in claim 1, wherein said power plane solution comprises analysis of electric charge accumulating on said power plane and electric charge accumulating on said ground plane, and further comprising analysis of a third voltage wave and a third current wave propagating radially from each of said drivers.

4. The method as recited in claim 1, wherein said first voltage level is a logic high voltage and said second voltage level is a logic low voltage.

5. The method as recited in claim 1, wherein said first voltage level is a logic low voltage and said second voltage level is a logic high voltage.

6. The method as recited in claim 1, wherein said transmission line is terminated with an open circuit.

7. The method as recited in claim 1, wherein said transmission line is terminated with a first resistor and a second resistor, said first resistor connected between said transmission line and said power plane and said second resistor connected between said transmission line and said ground plane.

8. The method as recited in claim 1, wherein said transmission line is placed above said power plane, and said power plane is placed above said ground plane.

9. The method as recited in claim 1, wherein said transmission line is placed between said power plane and said ground plane.

10. The method as recited in claim 9 further comprising modeling said transmission line as a first transmission line and a second transmission line.

11. The method as recited in claim 10, wherein said first transmission line is referenced to said power plane, and said second transmission line is referenced to said ground plane.

12. The method as recited in claim 1, wherein said electronic circuit includes a voltage regulator module.

13. The method as recited in claim 1, wherein said model of said electronic circuit is a mathematical model.

14. The method as recited in claim 13, wherein said model of said electronic circuit is a SPICE model.

15. A system for analyzing simultaneous switching noise, the system comprising:
    a model of an electronic circuit, said electronic circuit including:
       a plurality of drivers, each of said drivers coupled to a power plane, a ground plane, and a transmission line;
       a voltage source coupled to said power plane and said ground plane, wherein said voltage source is configured to provide a specified voltage between said power plane and said ground plane; and
       a plurality of decoupling capacitors;
    and a computer system configured to:
       simulate simultaneous switching of two or more of said drivers from a first voltage level to a second voltage level;
       calculate a transmission line solution;
       calculate a power plane solution;
       superimpose said transmission line solution and said power plane solution;
       calculate plane bounce, wherein said plane bounce comprises one or more voltage fluctuations between said power plane and said ground plane.

16. The system as recited in claim 15, wherein said transmission line solution comprises analysis of a first current wave and a first voltage wave propagating between said transmission line and said power plane and a second current wave and a second voltage wave propagating between said transmission line and said ground plane.

17. The system as recited in claim 15, wherein said power plane solution comprises analysis of electric charge accumulating on said power plane and electric charge accumulating on said ground plane, and further comprising analysis of a third voltage wave and a third current wave propagating radially from each of said drivers.

18. The system as recited in claim 15, wherein first voltage level is a logic high voltage and said second voltage level is a logic low voltage.

19. The system as recited in claim 15, wherein said first voltage level is a logic low voltage and said second voltage level is a logic high voltage.

20. The system as recited in claim 15, wherein said transmission line is terminated with an open circuit.

21. The system as recited in claim 15, wherein said transmission line is terminated with a first resistor and a second resistor, wherein said first resistor is connected between said transmission line and said power plane and said second resistor is connected between said transmission line and said ground plane.

22. The system as recited in claim 15, wherein said transmission line is arranged above said power plane, and said power plane is arranged above said ground plane.

23. The system as recited in claim 15, wherein said transmission line is arranged between said ground plane and said power plane.

24. The system as recited in claim 23 further comprising modeling said transmission line as a first transmission line and a second transmission line.

25. The system as recited in claim 24, wherein said first transmission line is referenced to said power plane and said second transmission line is referenced to said ground plane.

26. The system as recited in claim 15, wherein said electronic circuit includes a voltage regulator module.

27. The system as recited in claim 15, wherein said model of electronic circuit is a mathematical model.

28. The system as recited in claim 27, wherein said model of said electronic circuit is a SPICE model.

29. A method for analyzing simultaneous switching noise in an electronic circuit, the method comprising:
    providing a model of an electronic circuit, said electronic circuit including:
       a plurality of drivers, each of said drivers coupled to a power plane, a ground plane, and a transmission line, wherein the power and ground planes are each modeled as a mesh of transmission lines;
       a voltage source coupled to said power plane and said ground plane, wherein said voltage source is configured to provide a specified voltage between said power plane and said ground plane;
    simulating simultaneous switching of a two or more of said drivers from a first voltage level to a second voltage level;
    calculating a transmission line solution;
    calculating a power plane solution;
    superimposing said transmission line solution and said power plane solution; and
    analyzing plane bounce, wherein said plane bounce comprises one or more voltage fluctuations between said power plane and said ground plane.

30. The method as recited in claim 29, wherein said transmission line solution comprises analysis of a first current wave and first voltage wave propagating between said transmission line and said power plane and a second voltage wave and a second current wave propagating between said transmission line and said ground plane.

31. The method as recited in claim 29, wherein said power plane solution comprises analysis of electric charge accumulating on said power plane and electric charge accumulating on said ground plane, and further comprising analysis of a third voltage wave and a third current wave propagating radially from each of said drivers.

32. The method as recited in claim 29, wherein said first voltage level is a logic high voltage and said second voltage level is a logic low voltage.

33. The method as recited in claim 29, wherein the first voltage level is a logic low voltage and the second voltage level is a logic high voltage.

34. The method as recited in claim 29, wherein said transmission line is terminated with an open circuit.

35. The method as recited in claim 29, wherein said transmission line is terminated with a first resistor and a second resistor, said first resistor connected between said transmission line and said power plane and said second resistor connected between said transmission line and said ground plane.

36. The method as recited in claim 29, wherein said transmission line is placed between said power plane and said ground plane.

37. The method as recited in claim 36, further comprising modeling said transmission line as a first transmission line and a second transmission line.

38. The method as recited in claim 37, wherein said first transmission line is referenced to said power plane, and said second transmission line is referenced to said ground plane.

39. The method as recited in claim 29, wherein said electronic circuit includes a voltage regulator module.

40. The method as recited in claim 29, wherein said model of said electronic circuit is a mathematical model.

41. The method as recited in claim 40, wherein said model of said electronic circuit is a SPICE model.

42. A system for analyzing simultaneous switching noise, the system comprising:
   a model of an electronic circuit, said electronic circuit including:
       a plurality of drivers, each of said drivers coupled to a power plane, a ground plane, and a transmission line; and
       a voltage source coupled to said power plane and said ground plane, wherein said voltage source is configured to provide a specified voltage between said power plane and said ground plane, wherein the power and ground planes are each modeled as a mesh of transmission lines;
   and a computer system configured to:
       simulate simultaneous switching of two or more of said drivers from a first voltage level to a second voltage level;
       calculate a transmission line solution;
       calculate a power plane solution;
       superimpose said transmission line solution and said power plane solution;
       calculate plane bounce, wherein said plane bounce comprises one or more voltage fluctuations between said power plane and said ground plane.

43. The system as recited in claim 42, wherein said transmission line solution comprises analysis of a first current wave and a first voltage wave propagating between said transmission line and said power plane and a second current wave and a second voltage wave propagating between said transmission line and said ground plane.

44. The system as recited in claim 42, wherein said power plane solution comprises analysis of electric charge accumulating on said power plane and electric charge accumulating on said ground plane, and further comprising analysis of a third voltage wave and a third current wave propagating radially from each of said drivers.

45. The system as recited in claim 42, wherein first voltage level is a logic high voltage and said second voltage level is a logic low voltage.

46. The system as recited in claim 42, wherein said first voltage level is a logic low voltage and said second voltage level is a logic high voltage.

47. The system as recited in claim 42, wherein said transmission line is terminated with an open circuit.

48. The system as recited in claim 42, wherein said transmission line is terminated with a first resistor and a second resistor, wherein said first resistor is connected between said transmission line and said power plane and said second resistor is connected between said transmission line and said ground plane.

49. The system as recited in claim 42, wherein said transmission line is arranged above said power plane, and said power plane is arranged above said ground plane.

50. The system as recited in claim 42, wherein said transmission line is arranged between said ground plane and said power plane.

51. The system as recited in claim 50 further comprising modeling said transmission line as a first transmission line and a second transmission line.

52. The system as recited in claim 51, wherein said first transmission line is referenced to said power plane and said second transmission line is referenced to said ground plane.

53. The system as recited in claim 42, wherein said electronic circuit includes a voltage regulator module.

54. The system as recited in claim 42, wherein said model of electronic circuit is a mathematical model.

55. The system as recited in claim 54, wherein said model of electronic circuit is a mathematical model.

\* \* \* \* \*